United States Patent
Raberg

(10) Patent No.: US 6,638,774 B2
(45) Date of Patent: Oct. 28, 2003

(54) METHOD OF MAKING RESISTIVE MEMORY ELEMENTS WITH REDUCED ROUGHNESS

(75) Inventor: Wolfgang Raberg, Fishkill, NY (US)

(73) Assignee: Infineon Technologies, AG, Munich (DE)

(*) Notice: Subject to any disclaimer, the term of this patent is extended or adjusted under 35 U.S.C. 154(b) by 0 days.

(21) Appl. No.: 10/047,456

(22) Filed: Jan. 15, 2002

(65) Prior Publication Data

US 2003/0132468 A1 Jul. 17, 2003

(51) Int. Cl.[7] .............................................. H01L 21/00
(52) U.S. Cl. ............................ 438/3; 438/680; 365/173
(58) Field of Search ..................... 438/3, 680; 257/295; 428/692; 338/32 R; 360/324.1; 365/173

(56) References Cited

U.S. PATENT DOCUMENTS

| | | | | | |
|---|---|---|---|---|---|
| 5,874,886 | A | * | 2/1999 | Araki et al. ............... | 338/32 R |
| 6,110,751 | A | * | 8/2000 | Sato et al. ...................... | 438/3 |
| 6,312,840 | B1 | * | 11/2001 | Kumagai et al. ........... | 428/692 |
| 6,313,973 | B1 | * | 11/2001 | Fuke et al. ............... | 360/324.1 |
| 6,348,274 | B1 | * | 2/2002 | Kamiguchi et al. ......... | 428/692 |
| 6,376,337 | B1 | * | 4/2002 | Wang et al. ................ | 438/478 |
| 6,462,641 | B1 | * | 10/2002 | Dieny et al. ............... | 338/32 R |
| 6,480,412 | B1 | * | 11/2002 | Bessho et al. .............. | 365/173 |
| 2002/0036877 | A1 | * | 3/2002 | Sakakima et al. ...... | 360/324.11 |
| 2002/0097534 | A1 | * | 7/2002 | Sun et al. ................ | 360/324.2 |
| 2002/0853319 | | * | 7/2002 | Hayakawa et al. ...... | 360/324.2 |

FOREIGN PATENT DOCUMENTS

TW 386310 * 4/2000

OTHER PUBLICATIONS

Sakakima, H., et al. "Enhancement of MR ratios using thin oxide layers in PtMn and $\alpha$–$Fe_2O_3$–based spin valves" Journal of Magnetism and Magnetic Materials (2000) vol. 210, pp. L–20–24, Elsevier Science B.V.

Lee, W. Y., Carey, M., Toney, M. F., Rice, P., Gurney, B., Chang, H.–C., Allen, E., and Mauri, D., "Oxygen–enhanced IrMn spin valves deposited by ion–beam and magnetron sputtering", Journal of Applied Physics, Jun. 1, 2001, pp. 6925–6927, vol. 89, No. 11, 2001 American Institute of Physics.

* cited by examiner

Primary Examiner—David Nelms
Assistant Examiner—Thinh T. Nguyen
(74) Attorney, Agent, or Firm—Slater & Matsil, L.L.P.

(57) ABSTRACT

A resistive memory element (144), magnetic random access memory (MRAM) device, and methods of manufacturing thereof, wherein a thin oxide layer (132) is disposed within the first metal layer (136) of the memory element (144). The thin oxide layer (132) comprises an oxygen mono-layer. The roughness of subsequently-formed layers (134/118/116) is reduced, and magnetic capabilities of the resistive memory element (144) are enhanced by the use of the thin oxide layer (132) within the first metal layer (136).

17 Claims, 3 Drawing Sheets

METHOD OF MAKING RESISTIVE MEMORY ELEMENTS WITH REDUCED ROUGHNESS

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is an MRAM, which includes conductive lines positioned substantially perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAM's compared to traditional semiconductor memory devices such as DRAM's is that MRAM's are non-volatile. For example, a personal computer (PC) utilizing MRAM's would not have a long "boot-up" time as with conventional PCs that utilize DRAM's. Also, an MRAM does not need to be powered up and has the capability of "remembering" the stored data.

Because resistive memory devices such as MRAM's are relatively new types of memory devices, they present a variety of manufacturing and material challenges. For example, improved methods of forming resistive memory elements are needed.

SUMMARY OF THE INVENTION

Preferred embodiments of the present invention achieve technical advantages as a resistive memory element and method of manufacturing thereof that includes a thin oxide layer within the magnetic stack hard layer that reduces roughness of the resistive memory element.

In one embodiment, disclosed is a resistive memory element for a resistive memory device, comprising a first metal layer including a first metal portion comprising at least one magnetic metal layer. The first metal layer includes a thin oxide layer disposed over the first metal portion, and a second metal portion disposed over the thin oxide layer, the second metal portion comprising a plurality of magnetic metal layers. The resistive memory element includes a tunnel junction and a second metal layer, the second metal layer including a plurality of magnetic metal layers.

In another embodiment, disclosed is a resistive semiconductor memory device, comprising a plurality of first conductive lines positioned parallel to one another in a first direction and a plurality of resistive memory elements disposed over the first conductive lines. The resistive memory elements comprise a first metal layer including a first metal portion comprising at least one magnetic metal layer. The first metal layer includes a thin oxide layer disposed over the first metal portion, and a second metal portion disposed over the thin oxide layer. The second metal portion comprises a plurality of magnetic metal layers. The resistive semiconductor memory device includes a tunnel junction disposed over the first metal layer, and a second metal layer disposed over the tunnel junction, the second metal layer including a plurality of magnetic metal layers. A plurality of second conductive lines are disposed over the resistive memory elements, the second conductive lines being positioned parallel to one another in a second direction.

In another embodiment, disclosed is a method of manufacturing resistive memory elements of a resistive memory device, comprising providing a substrate, disposing a first metal layer first portion over the substrate, and forming a thin oxide layer over the first metal layer first portion. The method includes disposing a first metal layer second portion over the thin oxide layer, forming a tunnel layer over the first metal layer second portion, and disposing a second metal layer over the tunnel layer, wherein the second metal and first metal layers comprise a plurality of ferromagnetic metal layers.

In another embodiment, disclosed is a method of manufacturing a resistive memory device, comprising providing a semiconductor substrate, forming a plurality of a plurality of first conductive lines parallel to one another in a first direction over the substrate, and disposing a plurality of resistive memory elements over the first conductive lines, the resistive memory elements including a first metal layer having a thin oxide layer disposed therein. A plurality of second conductive lines are formed over the resistive memory elements, the second conductive lines being positioned parallel to one another in a second direction.

Advantages of embodiments of the invention include reducing the roughness of the ferromagnetic layers and tunneling layers of magnetic stacks. Reduced roughness of the layers above the thin oxide layer results in the reduction or elimination of Neel coupling that is problematic in prior art resistive memory elements. The thin oxide layer within the first metal layer provides the ability to manufacture a resistive memory element with a more predictable resistance than in the prior art. More uniform growth of the barrier layer is provided, and magnetic properties of magnetic resistive elements are also enhanced.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art MRAM designs will be described, followed by a discussion of some preferred embodiments and some advantages of embodiments of the present invention.

Figure 1:
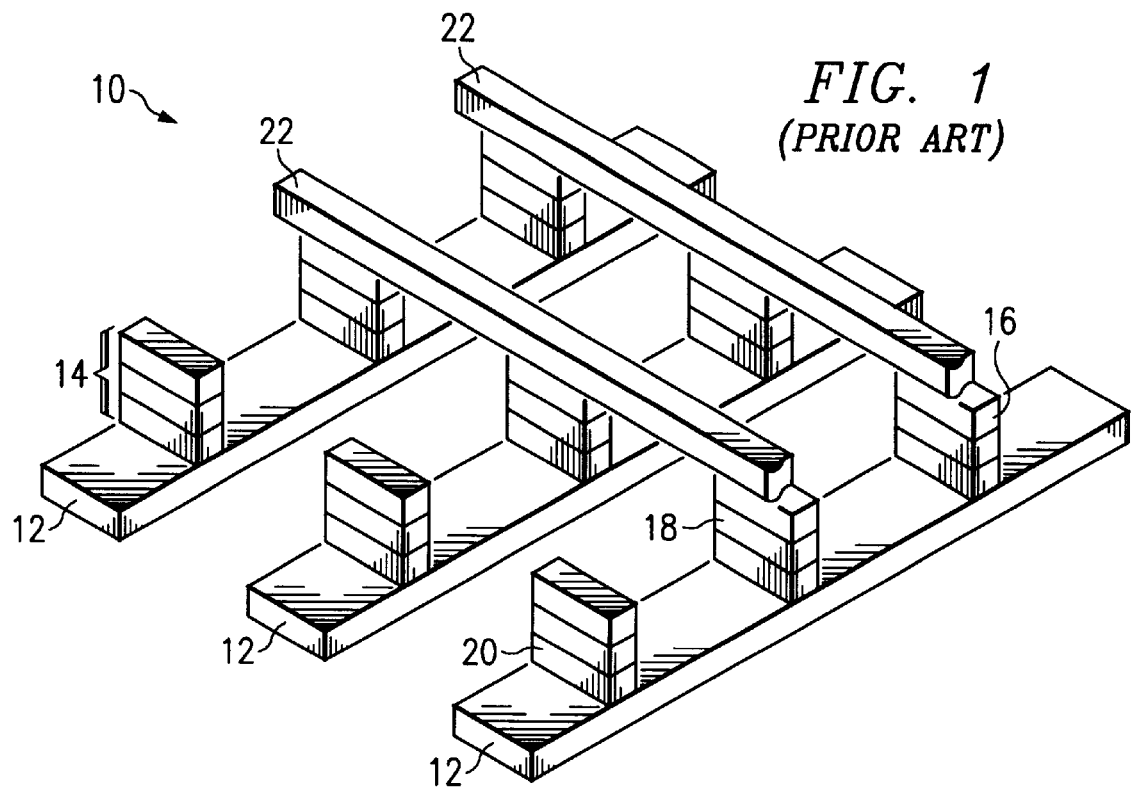
FIG. 1 illustrates a perspective view of a prior art MRAM array.

FIG. 1 illustrates a perspective view of a prior art MRAM 10 having bitlines 12 located substantially orthogonal to wordlines 22 in adjacent metallization layers. Magnetic stacks 14 are positioned between the bitlines 12 and wordlines 22 adjacent and electrically coupled to bitlines 12 and wordlines 22. The magnetic stacks 14 are also referred to herein as resistive memory elements.

A typical manufacturing process for the MRAM device 10 of FIG. 1 will next be described. A workpiece (not shown) is provided, typically comprising silicon oxide over silicon single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise silicon dioxide, for example. The inter-level dielectric layer is patterned, for example, for vias, and etched. The vias may be filled with a metal such as copper, tungsten or other metals, for example.

A metallization layer, e.g., an M2 layer comprising aluminum or copper, is formed next. If copper is used for the conductive lines 12, typically a damascene process is used to form the conductive lines 12. A dielectric, not shown, is deposited over inter-level dielectric layer and vias. The dielectric layer is patterned and etched, and the trenches are filled with conductive material to form conductive lines 12 in the M2 layer.

Next, a magnetic stack 14 is formed over conductive lines 12. The magnetic stack 14 typically comprises a first magnetic layer 20 including a plurality of layers of materials such as PtMn, NiMn, IrMn, FeMn, CoFe, Ru, Al, and NiFe, for example. The first magnetic layer 20 is often referred to as a hard layer. The magnetic stack 14 also includes a dielectric layer 18 comprising $Al_2O_3$, for example, deposited over the first magnetic layer 20. The dielectric layer 18 is often referred to as a tunnel layer, tunnel junction, or barrier layer. The magnetic stack 14 also includes a second magnetic layer 16 comprising a multi-layer structure having similar materials as the first magnetic layer 20. The second magnetic layer 16 is often referred to as the soft layer. The first magnetic layer 20, dielectric layer 18 and second magnetic layer 16 are patterned to form magnetic stacks 14. The magnetic stacks 14 are typically substantially rectangular or oval in shape.

Conductive lines 22 are formed over magnetic stacks 14. The conductive lines 22 may be formed within an M3 layer, for example, and are positioned in a different direction than conductive lines 12. If conductive lines 22 comprise copper, again, a damascene process is typically used. A dielectric layer (not shown) is deposited over magnetic stacks 14 and conductive lines 22. The dielectric layer is patterned and etched with trenches that will be filled with a conductive material to form conductive lines 22. Alternatively, a non-damascene process may be used to form conductive lines 12 and 22. Conductive lines 12 and 22 may function as the wordlines and bitlines of the MRAM array 10, as examples.

Figure 2:
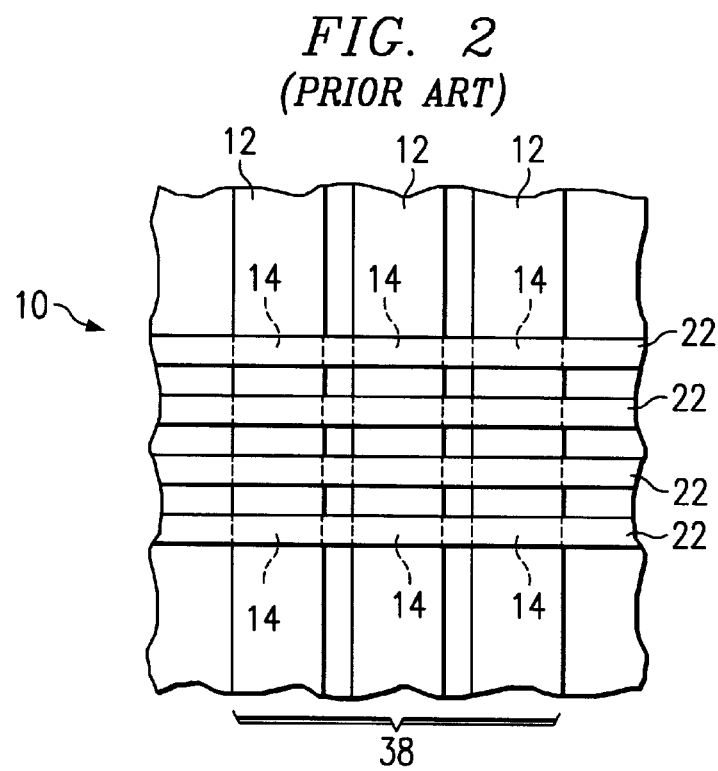
FIG. 2 shows a top view of the prior art MRAM array shown in FIG. 1.

The order of the magnetic stack 14 layers may be reversed, e.g., the hard layer 20 may be on the top of or above the insulating layer 18, and the soft layer 16 may be on the bottom of or below the insulating layer 18. Similarly, the wordlines 12 and bitlines 22 may be disposed either above or below the magnetic stack layers 14. FIG. 2 illustrates a top view of the prior art MRAM 10 shown in FIG. 1.

In MRAM's, information is stored in the soft magnetic layer 16 of the magnetic stacks 14. To store the information, the magnetization of one ferromagnetic layer or information layer, e.g., the soft layer 16, is aligned either parallel or anti-parallel to a second magnetic layer or reference layer, e.g., the hard layer 20. The information is detectable due to the fact that the resistance of a parallel element is different than an anti-parallel element. Switching from a parallel to an anti-parallel state, and vice versa, may be accomplished by running current, often referred to as the switching current, through both conductive lines 12 and 22, and from the hard layer 20 to the soft layer 16, or vice versa. The switching current induces a magnetic field at the location of the memory element 14 just large enough to change the magnetization of the information layer or soft layer 16. Tunneling current is current run through the element that is used for reading the resistive state.

For proper functionality of a resistive memory element 14, it is important that the magnetic layers and non-magnetic layers have very smooth interfaces. This is difficult to achieve using the current deposition processes for magnetic tunnel junctions (MTJ's). However, one problem with the MRAM 10 structure described above is that the hard layer 20 top surface has a high degree of roughness, as shown at 30 in the cross-sectional view shown in FIG. 3. The rough top surface 30 of the hard layer 20 results in ferromagnetic coupling, known as Neel coupling or orange peel coupling in the art. Neel coupling results in a resistive memory element 14 that is magnetically unsymmetric and therefore, unreliable. Neel coupling also causes the resistive memory element 14 to be difficult to switch. When a rough surface 30 exists on top of the soft layer 20, small polarizations in the interfaces of the layers occur, causing interactions of the various layers with one another, which is undesirable.

Figure 3:
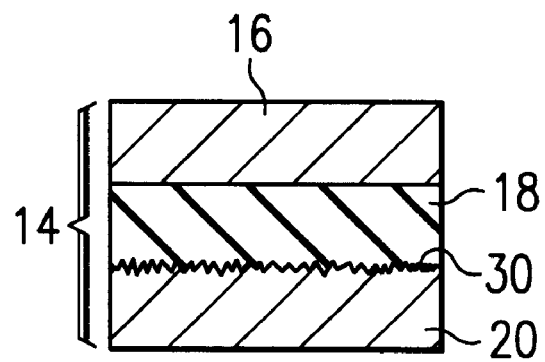
FIG. 3 shows a cross-sectional view of a prior art resistive memory element having roughness at the interface of the bottom ferromagnetic stack and the tunnel junction.

Another problem with the prior art resistive memory element 14 shown in FIG. 3 is that the rough surface 30 of the hard layer 20 makes it difficult to ensure the resistance that is desired for the resistive memory element 14 is achieved. The rough surface 30 causes a locally varying thickness of the barrier layer 18. For example, the typical resistance desired for the barrier layer 18 is 1 $k\Omega/\mu m^2$. The degree of roughness of the hard layer top surface 30 has an impact on the resistance of the resistive memory element 14: the more uniform or smooth the barrier layer 18 is, the more reliable the resistance.

Giant magneto-resistance (GMR) read heads are used to read the magnetic information of computer disk drives, and they utilize ferromagnetic materials similar to the materials used in MRAM's. The two technologies have many differences: for example, in GMR read heads, a tunnel junction or insulating barrier is not used. A conductive material is used at the interface of two ferromagnetic material layers, rather than an insulative tunnel junction, as in MRAM's. The relative orientation of ferromagnetics is used to read information in GMR read heads, using an electron-scattering effect, whereas MRAM's read information using a tunneling effect.

A recent development in the field of GMR read heads for computer disk drives is the use of nano-oxide layers (NOL), described by W. Y. Lee, et al. in the Journal of Applied Physics, 89 (11), at p. 6925 (2001), and references therein. The oxidation of a ferromagnetic material such as Co or CoFe to form an oxide layer of less than 1 nm in thickness has been shown to reduce the roughness of the interfaces above the oxidized layer significantly, and enhances the scattering of electrons. In GMR read heads, using nano-oxide layers in both ferromagnetic material layers has been attempted, in order to enhance the scattering of electrons.

Embodiments of the present invention utilize developments similar to those made in nano-oxide layers in GMR Read Heads in MRAM applications, to reduce the roughness of subsequently-deposited ferromagnetic layers and tunneling barrier. An nano-oxide oxide layer is formed halfway during the formation of the bottom ferromagnetic layer or hard layer of a resistive memory device, in accordance with embodiments of the present invention.

Embodiments of the present invention achieve technical advantages by providing resistive memory elements having a hard layer with reduced roughness on the top surface. Shown in FIG. 4 in a cross-sectional view, a resistive memory element or magnetic tunnel junction 144 in accordance with an embodiment of the invention includes a first metal layer or hard layer 136 having a first portion 120, and a thin oxide layer 132 formed over the hard layer first portion 120. With the exception of the thin oxide layer 132, which is a novel feature of embodiments of the present invention, an MRAM resistive memory element 144 may be manufactured in accordance with the method and structure described herein for FIGS. 1 through 3.

The hard layer first portion 120 preferably comprises at least one layer of ferromagnetic material, such as CoFe and/or NiFe or other magnetic materials, as examples. The hard layer first portion 120 preferably comprises around 1.0 to 1.5 nm of ferromagnetic material, for example. The hard layer first portion 120 may also include one or more layers comprising an antiferromagnetic material, such as FeMn, IrMn, Ru, $Al_2$ or PtMn, as examples.

Preferably, about halfway through the hard layer 120 deposition process, the hard layer first portion 120 is exposed to oxygen to form a thin oxide layer 132 over the hard layer first portion 120. The thin oxide layer 132 preferably comprises an oxide having a thickness of 1 nm or less, and may comprise Co or CoFe, for example. The thin oxide layer 132 preferably comprises a mono-layer of $O_2$ molecules, or a single atomic layer of $O_2$. For example, the thin oxide layer 132 may comprise approximately two to five A of oxide, which may be formed by exposing the hard magnetic layer first portion 120 to a gas dose that creates the adsorption of a monolayer of $O_2$ on the hard layer first portion 120 surface. Alternatively, the thin oxide layer 132 may be formed over the hard layer first portion 120 by a sputter deposition process, physical vapor deposition (PVD), ion beam deposition (IBD), or plasma deposition, as examples, although other deposition methods may also be used. The thin oxide layer 132 is preferably thin enough so that the surface of the hard layer first portion remains conductive. In accordance with embodiments of the invention, the resistance induced by the thin oxide layer 132 is negligible compared to the tunnel barrier or tunnel junction 118, to be described later, resistance.

After the formation of the thin oxide layer 132, the deposition of the first metal layer or hard layer 136 is continued. A second portion 134 of the hard layer 136 is disposed over the thin oxide layer 132. The hard layer second portion 120 preferably comprises around 1.0 to 1.5 nm of ferromagnetic material, for example. The hard layer second portion 120 may comprise a plurality of magnetic and non-magnetic layers, comprising PtMn, CoFe, Ru, $Al_2$, and/or NiFe, or combinations thereof, as examples.

Preferably, the thin oxide layer 132 is sufficiently thin such that it effectively floats on the surface of the first portion 120 of the hard layer, thereby acting as a growth enhancer for the formation of the hard layer second portion 134 over the thin oxide layer 132. By "swimming" on the hard layer first portion 120 surface, the thin oxide layer 132 assists the incoming material or atoms, enhancing the mobility of the atoms deposited, and helping these atoms to seek out weakened sites upon which to adhere, to form hard layer second portion 134. By "swimming" on the surface, essentially, the $O_2$ remains unreactive for a period of time, i.e., $O_2$ acts as a surfactant inducing a layer by layer growth. For example, in a vacuum chamber, a small amount or monolayer, e.g. 1 layer of $O_2$ atoms, may be placed upon the surface of the hard layer first portion 120, e.g. for a few seconds at $1 \times 10^{-6}$ Torr. Preferably, the hard layer second portion 134 comprises CoFe and/or NiFe, as examples.

An insulating layer 118 is deposited over the second portion 134 of the hard layer 136. The insulating layer 118 comprises the tunnel junction or barrier layer of the resistive memory element 144, and preferably comprises a dielectric such as $Al_2O_3$, as an example.

A second metal layer or soft layer 116 is formed over the tunnel junction 118, as described for the prior art. The soft layer 116 preferably comprises a plurality of magnetic and non-magnetic layers, comprising CoFe and/or NiFe, or combinations thereof, as examples.

Figure 5:
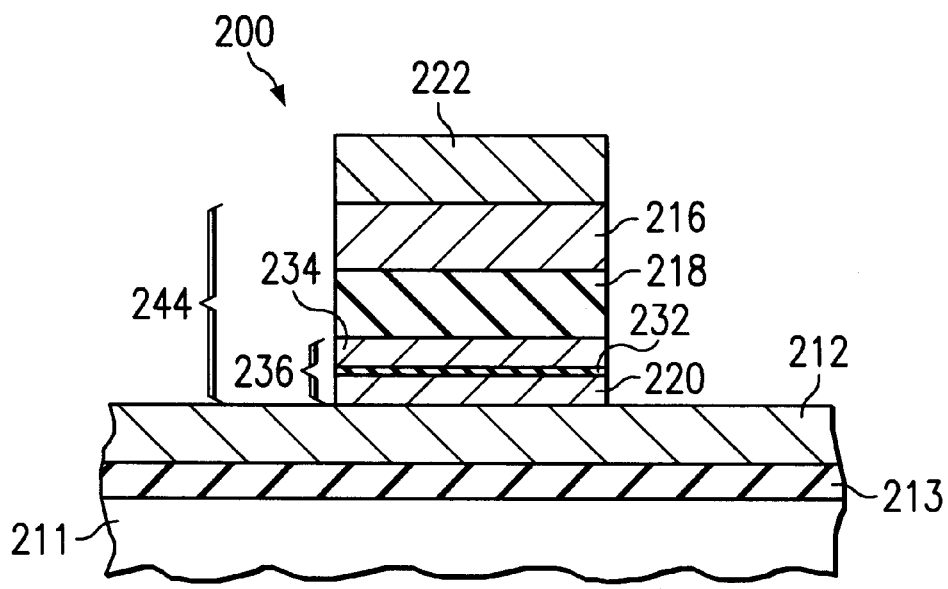
FIG. 5 shows another embodiment of the present invention.

Conductive lines are formed above and below the resistive memory elements, as described for the prior art, and as shown in FIG. 5.

FIG. 5 illustrates an embodiment of the present invention, an MRAM device 200 having a magnetic tunnel junction 244 with a thin oxide layer 232 within a hard layer 236. A substrate 211 is provided, and an insulating layer 213 is formed over the substrate. The substrate may comprise silicon or other semiconductors, and the insulating layer 213 may comprise an oxide, such as silicon dioxide, as examples.

First conductive lines 212 are formed over the insulating layer 213. Conductive lines 212 may comprise Cu, Al, and/or other metals, as examples. Conductive lines 212 may include a liner (not shown), comprising Ti, Ta, or W, as examples.

Figure 4:
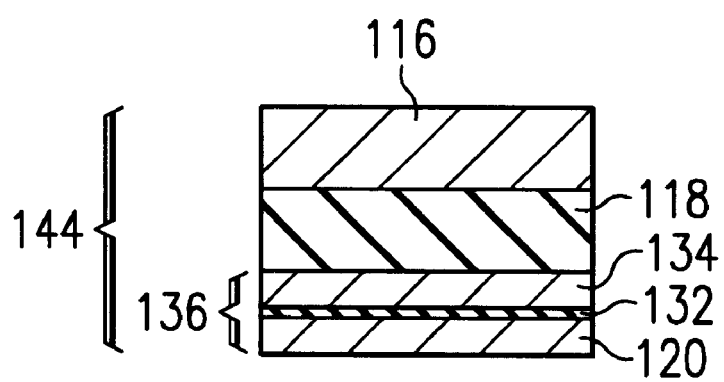
FIG. 4 illustrates in cross-section a resistive memory element according to an embodiment of the present invention, having a thin oxide layer formed within the bottom ferromagnetic stack or hard layer.

Resistive memory elements 244 are formed over the first conductive lines 212, as described for FIG. 4. The first metal layer or hard layer 236 includes a thin oxide layer 232 disposed between a first portion 220 and a second portion 234. The hard layer 236 includes a first portion 220 and second portion 234 that are disposed on either side of the thin oxide layer 232. The hard layer first and second portions 220/234 preferably comprise a plurality of layers of metals such as PtMn, CoFe, Ru, $Al_2$, and/or NiFe, or combinations thereof, as examples.

An insulating layer 218 is deposited over the second portion 234 of the first metal layer or hard layer 236. The insulating layer 218 comprises the tunnel junction or barrier layer of the resistive memory element 244, and preferably comprises a dielectric such as $Al_2O_3$, as an example.

A second metal layer or soft layer 216 is formed over the tunnel junction 218, as described for the prior art. The soft layer 216 preferably comprises a plurality of layers of metals such as CoFe and/or NiFe, or combinations thereof, as examples. Conductive lines 222 are formed above the resistive memory elements 244, as described for the prior art.

Preferably, only one thin oxide layer 132/232 is disposed within the resistive memory device 144/244, in accordance with embodiments of the invention, only one thin oxide layer 132/232 may be used because the layer that most benefits the use of the thin oxide layer 132/232 is the insulating layer, or barrier layer 118/218, which is coupled to and interfaces the top surface of the hard layer 136/236. In contrast, for GMR read head applications, more than one thin oxide layer is used, one for each ferromagnetic layer.

Figure 6:
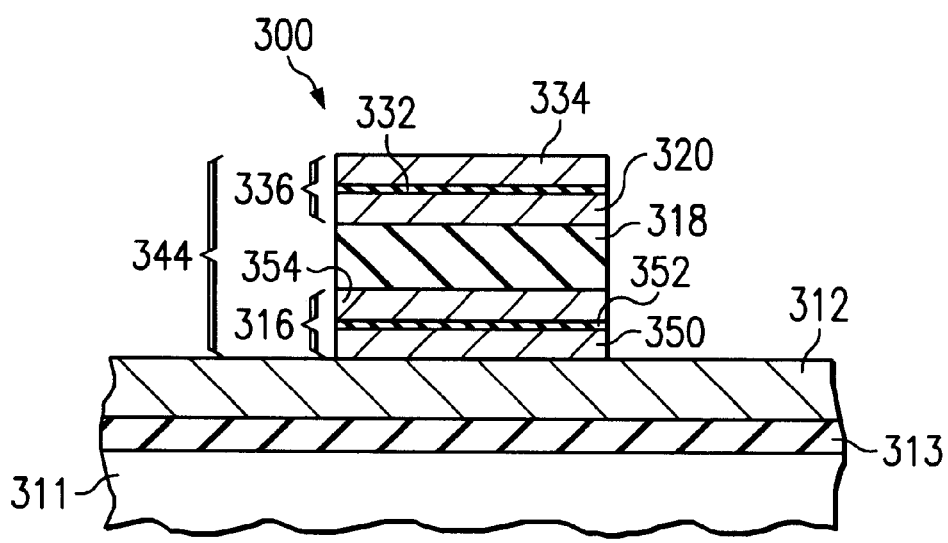
FIG. 6 shows an embodiment of the present invention including a thin oxide layer in both the soft layer and hard layer of the magnetic stack.

In another embodiment of the present invention, shown in FIG. 6, the magnetic stack comprises the inverse series of metals, compared to the embodiments previously described. In this embodiment, first a soft magnetic layer 316, then the tunnel barrier 318, and then a hard magnetic layer 336 are formed. To enhance the growth, a thin oxide layer 352 is formed into the soft magnetic layer 316, similar to the thin oxide layer 132/232 formed in the hard layer 136/236, as described for other embodiments herein. The soft layer 315 includes a first metal layer 350, a first thin oxide layer 352 disposed over the first metal layer 350, and a second metal layer 354 disposed over the first thin oxide layer 352.

In addition, when the soft layer 316 is the first magnetic layer formed, a thin oxide layer 332 may also be deposited into the hard magnetic layer 336, to improve the growth of the hard magnetic layer 336. When a second thin oxide layer 332 is utilized, the second metal layer or hard layer 336 comprises a first metal portion 320, a second thin oxide layer 332 disposed over the first metal portion 320, and a second metal portion 334 disposed over the second thin oxide layer 332.

Embodiments of the present invention achieve technical advantages by reducing or eliminating ferromagnetic or Neel coupling, improving the magnetic properties of resistive memory elements 144/244/344. Reduced roughness in the top surface of the first metal layer or hard layer 136/236 is achieved by the use of the thin oxide layer 132/236 of embodiments of the present invention. The thin oxide layer 132/232 reduces the roughness of subsequently-formed layers 134/118/116/234/218/216. Similarly, thin oxide layer 352 formed within soft layer 316 reduces roughness in the top surface of the soft layer 316. The thin oxide layers 132/232/332/352 are preferably very thin, having a negligible influence on the resistance of the memory elements 144/244/344. Furthermore, the resistance of the tunnel junction 118/218/318 may be more accurately determined with the use of the thin oxide layer 132/232/332/352 within the hard layer 136/236/336 and/or soft layer 316. Magnetic properties of the magnetic resistive elements 144/244/344 are also enhanced.

Embodiments of the invention are described herein with reference to a particular application for an MRAM device herein; however, embodiments of the invention also have application and are useful in other resistive semiconductor device applications.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing resistive memory elements of a resistive memory device, comprising:

providing a substrate;

disposing a first metal layer first portion over the substrate;

forming a first thin oxide layer over the first metal layer first portion, the first thin oxide layer comprising a mono-layer of $O_2$ molecules;

disposing a first metal layer second portion over the thin oxide layer;

forming a tunnel layer over the first metal layer second portion; and disposing a second metal layer over the tunnel layer, wherein the second metal and first metal layers comprise a plurality of ferromagnetic metal layers.

2. The method according to claim 1, wherein forming the first thin oxide layer comprises forming an oxide layer having a thickness of 1 nm or less.

3. The method according to claim 1, wherein forming the first thin oxide layer comprises forming an oxide layer comprising Co or CoFe.

4. The method according to claim 1, wherein forming the first thin oxide layer comprises forming an oxide layer comprising around 2 Angstroms of oxygen.

5. The method according to claim 1, wherein disposing the first metal layer first portion comprises disposing around 1.0 to 1.5 nm of ferromagnetic material over the substrate, wherein disposing the second metal portion comprises disposing around 1.0 to 1.5 nm of ferromagnetic material.

6. The method according to claim 1, wherein disposing the second metal layer comprises:

disposing a first metal portion over the tunnel layer;

disposing a second thin oxide layer over the first metal portion; and disposing a second metal portion over the second thin oxide layer.

7. A method of manufacturing a resistive memory device, comprising:

providing a semiconductor substrate;

forming a plurality of a plurality of first conductive lines parallel to one another in a first direction over the substrate;

disposing a plurality of resistive memory elements over the first conductive lines, the resistive memory elements including a first metal layer having a thin oxide layer disposed therein, the first thin oxide layer comprising a mono-layer of $O_2$ molecules; and forming a plurality of second conductive lines over the resistive memory elements, the second conductive lines being positioned parallel to one another in a second direction.

8. The method according to claim 7, wherein disposing the resistive memory elements comprises:

disposing a first metal layer first portion over the first conductive lines;

forming the first thin oxide layer over the first metal layer first portion;

disposing a first metal layer second portion over the first thin oxide layer;

forming a tunnel layer over the first metal layer second portion; and disposing a second metal layer over the tunnel layer, wherein the second metal and first metal layers comprise a plurality of ferromagnetic metal layers.

9. The method according to claim 8, wherein disposing the second metal layer comprises:

disposing a first metal portion over the tunnel layer;

disposing a second thin oxide layer over the first metal portion; and disposing a second metal portion over the second thin oxide layer.

10. A method of manufacturing resistive memory elements of a resistive memory device, comprising:

providing a substrate;

disposing a first metal layer first portion over the substrate;

forming a first thin oxide layer over the first metal layer first portion, the first thin oxide layer comprising approximately 2 Angstroms of oxygen;

disposing a first metal layer second portion over the thin oxide layer;

forming a tunnel layer over the first metal layer second portion; and disposing a second metal layer over the tunnel layer, wherein the second metal and first metal layers comprise a plurality of ferromagnetic metal layers.

11. The method according to claim 10, wherein forming the first thin oxide layer comprises forming an oxide layer comprising Co or CoFe.

12. The method according to claim 10, wherein forming the first thin oxide layer comprises forming an oxide layer comprising a mono-layer of $O_2$ molecules.

13. The method according to claim 10, wherein disposing the first metal layer first portion comprises disposing around 1.0 to 1.5 nm of ferromagnetic material over the substrate, wherein disposing the second metal portion comprises disposing around 1.0 to 1.5 nm of ferromagnetic material.

14. The method according to claim 10, wherein disposing the second metal layer comprises:

disposing a first metal portion over the tunnel layer;

disposing a second thin oxide layer over the first metal portion; and disposing a second metal portion over the second thin oxide layer.

15. A method of manufacturing a resistive memory device, comprising:

providing a semiconductor substrate;

forming a plurality of a plurality of first conductive lines parallel to one another in a first direction over the substrate;

disposing a plurality of resistive memory elements over the first conductive lines, the resistive memory elements including a first metal layer having a thin oxide layer disposed therein, the first thin oxide layer comprising approximately 2 Angstroms of oxygen; and forming a plurality of second conductive lines over the resistive memory elements, the second conductive lines being positioned parallel to one another in a second direction.

16. The method according to claim 15, wherein disposing the resistive memory elements comprises:

disposing a first metal layer first portion over the first conductive lines;

forming the first thin oxide layer over the first metal layer first portion;

disposing a first metal layer second portion over the first thin oxide layer;

forming a tunnel layer over the first metal layer second portion; and disposing a second metal layer over the tunnel layer, wherein the second metal and first metal layers comprise a plurality of ferromagnetic metal layers.

17. The method according to claim 15, wherein disposing the second metal layer comprises:

disposing a first metal portion over the tunnel layer;

disposing a second thin oxide layer over the first metal portion; and disposing a second metal portion over the second thin oxide layer.

* * * * *